(12) United States Patent
Yoon et al.

(10) Patent No.: US 12,463,168 B2
(45) Date of Patent: Nov. 4, 2025

(54) SEMICONDUCTOR PACKAGE

(71) Applicant: SAMSUNG ELECTRONICS CO., LTD., Suwon-si (KR)

(72) Inventors: Yeohoon Yoon, Yongin-si (KR); Ilho Kim, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 614 days.

(21) Appl. No.: 17/714,714

(22) Filed: Apr. 6, 2022

(65) Prior Publication Data

US 2023/0021362 A1      Jan. 26, 2023

(30) Foreign Application Priority Data

Jul. 26, 2021   (KR) .......................... 10-2021-0097590

(51) Int. Cl.
*H01L 23/00*       (2006.01)
*H01L 23/498*      (2006.01)

(52) U.S. Cl.
CPC .............. *H01L 24/20* (2013.01); *H01L 24/13* (2013.01); *H01L 24/73* (2013.01);
(Continued)

(58) Field of Classification Search
CPC ......... H01L 24/20; H01L 24/13; H01L 24/73; H01L 23/49816; H01L 23/49822; H01L 23/49838
(Continued)

(56) References Cited

U.S. PATENT DOCUMENTS 6,596,618 B1 * 7/2003 Narayanan ........... H05K 3/3473
                                                       438/760
8,674,506 B2   3/2014 Bezama et al.
(Continued)

FOREIGN PATENT DOCUMENTS

KR   10-2013-0080748 A    7/2013
KR   10-2020-0134012 A   12/2020

OTHER PUBLICATIONS

Communication issued Jun. 9, 2025 by the Korean Intellectual Property Office in Korean Patent Application No. 10-2021-0097590.

*Primary Examiner* — Ori Nadav
(74) *Attorney, Agent, or Firm* — Sughrue Mion, PLLC

(57) ABSTRACT

A semiconductor package is provided. The semiconductor package includes a redistribution structure having a front surface and a rear surface opposite the front surface, the redistribution structure including an insulating layer and a redistribution conductor provided in the insulating layer; a semiconductor chip provided on the rear surface and including a connection pad electrically connected to the redistribution conductor; an encapsulant provided on at least a portion of the semiconductor chip; under-bump metal (UBM) vias extending from the redistribution conductor to the front surface of the redistribution structure within the insulating layer; UBM pads provided on the front surface of the redistribution structure to correspond to the UBM vias, respectively, and each UBM pad of the UBM pads having an exposed surface convexly protruding away from the front surface of the redistribution structure; and a metal bump provided on the UBM pads and contacting the exposed surface of each UBM pad of the UBM pads.

17 Claims, 10 Drawing Sheets

(52) U.S. Cl.
CPC .. *H01L 23/49816* (2013.01); *H01L 23/49822* (2013.01); *H01L 23/49838* (2013.01); *H01L 24/16* (2013.01); *H01L 2224/13006* (2013.01); *H01L 2224/13008* (2013.01); *H01L 2224/13016* (2013.01); *H01L 2224/16227* (2013.01); *H01L 2224/16237* (2013.01); *H01L 2224/2101* (2013.01); *H01L 2224/2105* (2013.01); *H01L 2224/211* (2013.01); *H01L 2224/214* (2013.01); *H01L 2224/215* (2013.01); *H01L 2224/73101* (2013.01)

(58) Field of Classification Search
USPC ....................................................... 257/690
See application file for complete search history.

(56) References Cited

U.S. PATENT DOCUMENTS

| | | |
|---|---|---|
| 9,799,618 B1 | 10/2017 | Arvin et al. |
| 10,665,535 B2 * | 5/2020 | Lee ................... H01L 21/4857 |
| 2004/0182915 A1 | 9/2004 | Bachman et al. |
| 2008/0150134 A1 | 6/2008 | Shinkai et al. |
| 2009/0283903 A1 | 11/2009 | Park |
| 2010/0213609 A1 | 8/2010 | Kondou et al. |
| 2012/0199967 A1 | 8/2012 | Stacey |
| 2013/0175685 A1 | 7/2013 | Wu et al. |
| 2014/0054767 A1 * | 2/2014 | Yoshida ................ H01L 24/03 257/737 |
| 2016/0233187 A1 * | 8/2016 | Kim ................... H01L 23/3114 |
| 2017/0330855 A1 * | 11/2017 | Tung ................... H01L 25/0657 |
| 2020/0161261 A1 | 5/2020 | Jang et al. |

* cited by examiner

SEMICONDUCTOR PACKAGE

CROSS-REFERENCE TO RELATED APPLICATION(S)

This application claims priority to Korean Patent Application No. 10-2021-0097590, filed on Jul. 26, 2021, in the Korean Intellectual Property Office, the disclosure of which is incorporated by reference herein in its entirety.

BACKGROUND

The present disclosure relates to a semiconductor package.

Under-bump metal (UBM) structures may be formed between redistribution layers and solder balls to enhance board level reliability of semiconductor packages. However, in the case in which the surface of a UBM structure is not completely covered by a solder ball, the exposed surface of the UBM structure may corrode.

SUMMARY

Example embodiments provide a semiconductor package having improved reliability.

According to example embodiments, a semiconductor package includes a redistribution structure having a front surface and a rear surface opposite the front surface, the redistribution structure including an insulating layer and a redistribution conductor provided in the insulating layer; a semiconductor chip provided on the rear surface and including a connection pad electrically connected to the redistribution conductor; an encapsulant provided on at least a portion of the semiconductor chip; under-bump metal (UBM) vias extending from the redistribution conductor to the front surface of the redistribution structure within the insulating layer; UBM pads provided on the front surface of the redistribution structure to correspond to the UBM vias, respectively, and each UBM pad of the UBM pads having an exposed surface convexly protruding away from the front surface of the redistribution structure; and a metal bump provided on the UBM pads and contacting the exposed surface of each UBM pad of the UBM pads.

According to example embodiments, a semiconductor package includes a redistribution structure having a front surface and a rear surface opposite the front surface, the redistribution structure including a redistribution conductor and an insulating layer provided on the redistribution conductor, the insulating layer defining a via hole exposing a portion of the redistribution conductor; a semiconductor chip provided on the rear surface and including a connection pad electrically connected to the redistribution conductor; an under-bump metal (UBM) structure electrically connected to the redistribution conductor exposed through the via hole; and a metal bump provided on the UBM structure, wherein the UBM structure includes: a seed layer extending along an inner surface of the via hole; a UBM via provided on the seed layer in the via hole; and a UBM pad having a first surface and a second surface, the first surface extending in a direction parallel to the front surface of the redistribution structure and contacting the UBM via, and the second surface convexly protruding away from the first surface and contacting the metal bump.

According to example embodiments, a semiconductor package includes a redistribution structure having a front surface and a rear surface opposite the front surface, the redistribution structure including a redistribution conductor, and an insulating layer provided on the redistribution conductor, the insulating layer defining a via hole exposing a portion of the redistribution conductor; a semiconductor chip provided on the rear surface and including a connection pad electrically connected to the redistribution conductor; and an under-bump metal (UBM) structure electrically connected to the redistribution conductor exposed through the via hole, wherein the UBM structure includes: a seed layer extending along an inner surface of the via hole and a portion of the front surface of the redistribution structure, a UBM via provided on the seed layer in the via hole, and a UBM pad extending in a first direction parallel to the front surface of the redistribution structure, the pad having a first surface contacting the UBM via and a portion of the seed layer, and a second surface convexly protruding away from the first surface.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments will be described with reference to the accompanying drawings.

Figure 1:
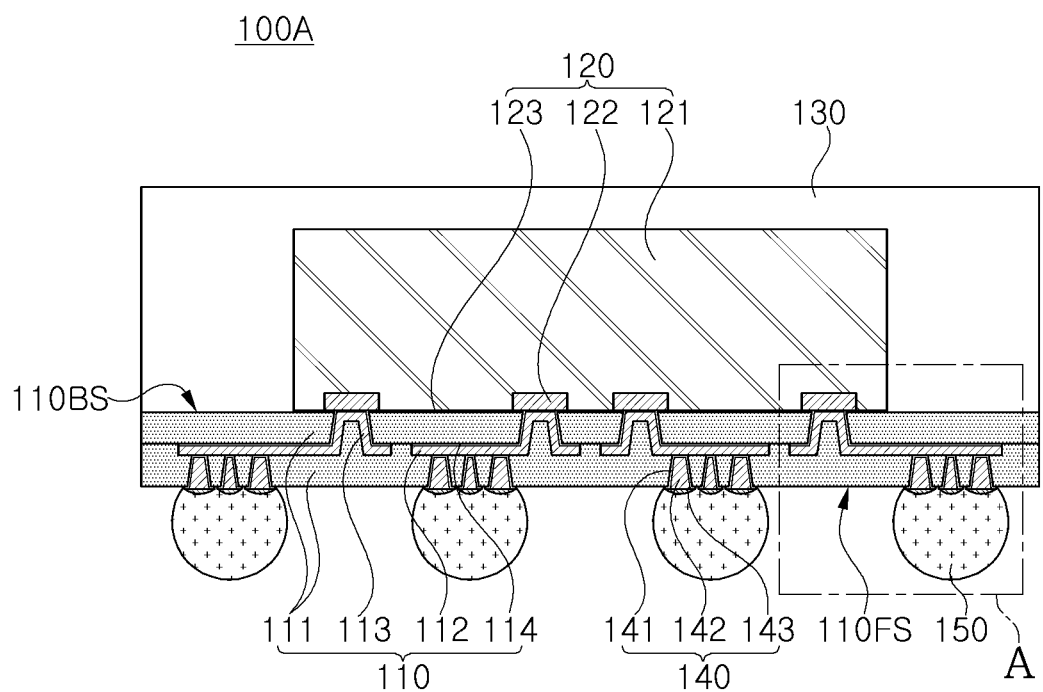
FIG. 1 is a cross-sectional view illustrating a semiconductor package according to an example embodiment.
Figure 2A:
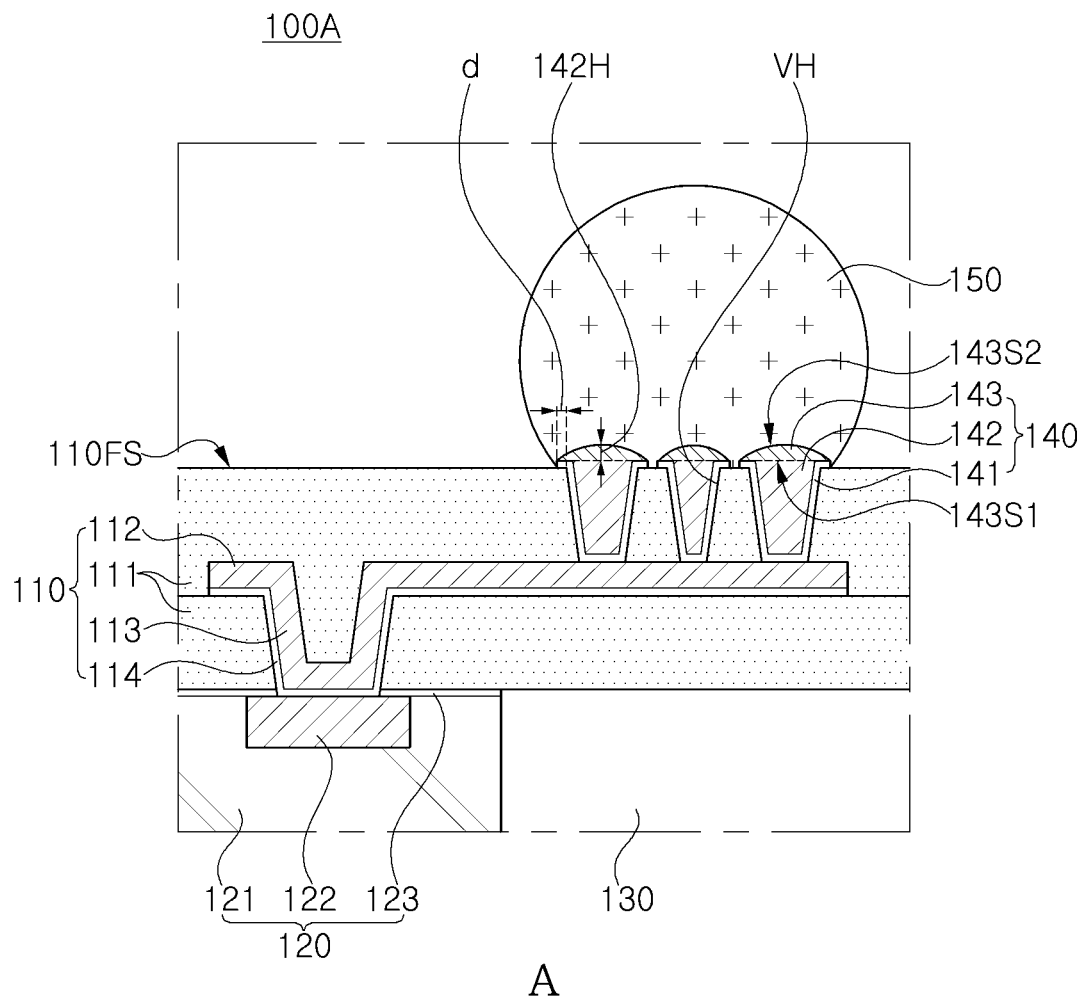
FIG. 2A is a partially enlarged view illustrating area 'A' of FIG. 1 according to an example embodiment.
Figure 2B:
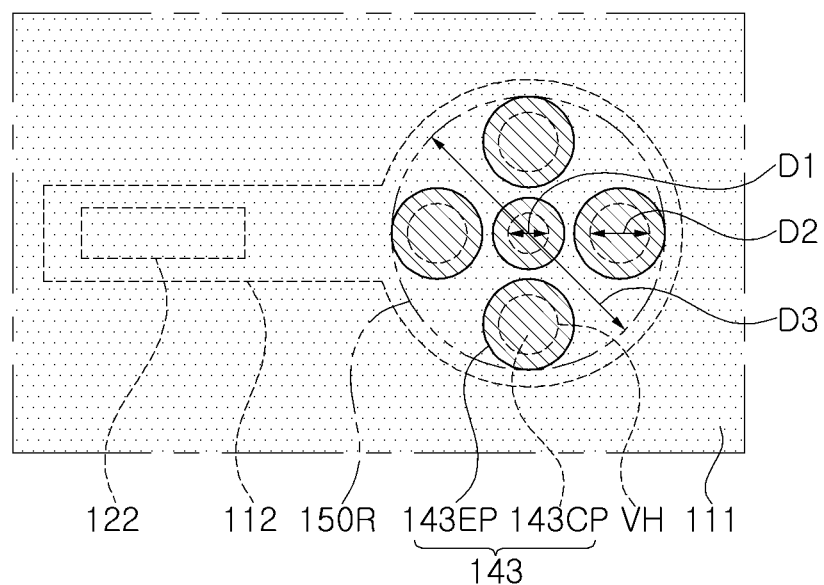
FIG. 2B is a plan view of the area illustrated in FIG. 2A according to an example embodiment.

FIG. 1 is a cross-sectional view illustrating a semiconductor package 100A according to an example embodiment, FIG. 2A is a partially enlarged view illustrating area 'A' of FIG. 1 according to an example embodiment, and FIG. 2B is a plan view illustrating an area illustrated in FIG. 2A according to an example embodiment.

Referring to FIGS. 1, 2A and 2B, a semiconductor package 100A according to an example embodiment may include a redistribution structure 110, a semiconductor chip 120, and a UBM structure 140. Also, the semiconductor package 100A may further include an encapsulant 130 and/or a metal bump 150. The UBM structure 140 may have a rounded surface, and the metal bump 150 may be implemented to completely cover the exposed surface of the UBM pad 143 without a pretreatment process for wetting of the metal bump 150. Because the UBM structure 140 is not exposed, corrosion of the UBM structure 140 may be prevented, and reliability of the UBM structure 140 and the semiconductor package 100A may be improved. In this case, the "pretreatment process for wetting of the metal bump 150" refers to a process performed before the Solder Ball Attach (SBA) process which may include, for example, a process of coating the surface of the UBM pad with a material similar to a solder ball to induce the metal bump 150 to be wetted to the side of the UBM pad. Hereinafter, components will be described with reference to the drawings.

The redistribution structure 110 may have a front surface 110FS and a rear surface 110BS positioned opposite to the front surface 110FS, and may include an insulating layer 111 and a redistribution conductor 112 disposed in the insulating layer 111. For example, the redistribution structure 110 may include a fan-in region overlapping the semiconductor chip 120 along a direction perpendicular to the rear surface 110BS, and a fan-out region extending from the fan-in region in a direction parallel to the rear surface 110BS, but example embodiments are not limited thereto. In addition, the number of the insulating layers 111 and the redistribution conductors 112 of the redistribution structure 110, and the number of layers thereof, are not limited to those illustrated in the drawings. For example, the redistribution structure 110 may include a greater number of insulating layers 111 and redistribution conductors 112 than those illustrated in the drawings.

The insulating layer 111 may cover the redistribution conductor 112 and may have a via hole VH exposing at least a portion of the redistribution conductor 112. The insulating layer 111 may include a plurality of insulating layers 111 disposed in a stacking direction of the semiconductor chip 120. For example, the insulating layer 111 may more than two layers. The insulating layer 111 may include an insulating material. Examples of the insulating material may include a thermosetting resin such as an epoxy resin, a thermoplastic resin such as polyimide, or a resin in which these resins are impregnated with inorganic fillers and/or glass fibers (Glass Fiber, Glass Cloth, Glass Fabric), for example, a prepreg, Ajinomoto Build-up Film (ABF), FR-4, and BismaleimideTriazine (BT). For example, the insulating layer 111 may include a photoimageable resin such as a photoimageable dielectric (PID) resin, which may allow the insulating layer 111 to be thinner than when other insulating materials are included, and the redistribution conductor 112 may be formed more finely. When the insulating layer 111 includes multiple layers, the different layers may include the same material or different materials, and the boundary between the insulating layers 111 of different levels may be unclear depending on the process.

The redistribution conductor 112 may be disposed on or in the insulating layer 111. The redistribution conductor 112 may include a via portion 113 penetrating through the insulating layer 111. A redistribution seed layer 114 may be disposed between the insulating layer 111 and the redistribution conductor 112, and between the insulating layer 111 and the via portion 113. The redistribution conductor 112 may redistribute connection pads 122 of the semiconductor chip 120. For example, the redistribution conductor 112 may redistribute the connection pads 122 of the semiconductor chip 120 to the fan-out region. In this case, the "fan-out region" refers to a region that does not overlap the semiconductor chip 120 along the vertical direction. The redistribution conductor 112 may include a metal material including, for example, copper (Cu), aluminum (Al), silver (Ag), tin (Sn), gold (Au), nickel (Ni), lead (Pb), titanium (Ti), or alloys thereof. The redistribution conductor 112 may perform various functions according to a design. For example, the redistribution conductor 112 may include a ground pattern, a power pattern, and a signal pattern.

The via portion 113 may pass through the insulating layer 111 to electrically connect the connection pad 122 and the redistribution conductor 112. According to an example embodiment, the redistribution conductor 112 includes a plurality of redistribution conductors 112 positioned at different levels, and the via portion 113 may also connect the redistribution conductors 112 of different levels to each other. The via portion 113 may be formed of the same or similar metal material as that of the redistribution conductor 112 and, for example, may include copper (Cu), aluminum (Al), silver (Ag), tin (Sn), gold (Au), nickel (Ni), lead (Pb), titanium (Ti), or alloys thereof. The via portion 113 may be a filled via in which a metal material is filled in the via hole VH or a conformal via in which a metal material extends along the inner surface of the via hole VH.

The redistribution seed layer 114 may extend between the redistribution conductor 112 and the insulating layer 111 and the connection pad 122 along the inner surface of the via hole VH and the surface of the insulating layer 111. The redistribution seed layer 114 may be formed of a metallic material and, for example, may include copper (Cu), aluminum (Al), silver (Ag), tin (Sn), gold (Au), nickel (Ni), lead (Pb), titanium (Ti), or alloys thereof. The redistribution seed layer 114 may have a thin film shape having a single-layer or multi-layer structure. The redistribution seed layer 114 may include, for example, a first layer including titanium (Ti) and a second layer including copper (Cu).

The semiconductor chip 120 is disposed on the rear surface 100BS of the redistribution structure 110, and may include the body 121, the connection pad 122, and a passivation layer 123. The body 121 may include a semiconductor substrate including a semiconductor element such as silicon and germanium or a compound semiconductor such as silicon carbide (SiC), gallium arsenide (GaAs), indium arsenide (InAs), and indium phosphide (InP), and an Integrated Circuit (IC) formed on the semiconductor substrate. The connection pad 122 electrically connected to an integrated circuit may be disposed on the active surface of the body 121. The connection pad 122 may be electrically connected to the redistribution conductor 112 through the via portion 113. The connection pad 122 may include, for example, a metal material such as aluminum (Al). An insulating film such as a silicon oxide film, a silicon nitride film, or a silicon oxynitride film may be formed on the upper surface and the lower surface of the body 121. For example, the connection pad 122 may be disposed on the silicon nitride layer. The passivation layer 123 may have an opening exposing at least a portion of the connection pad 122. The passivation layer 123 may protect the semiconductor chip 120 that has been processed at the wafer level, and may protect the semiconductor chip 120 from mechanical and thermal stress applied in the packaging process. The passivation layer 123 may include an insulating material having excellent heat resistance, chemical resistance, mechanical properties, electrical properties, and the like. For example, the passivation layer 123 may be formed using photosensitive polyimide (PSPI). The semiconductor chip 120 may be a logic chip or a memory chip. Logic chips may include, for example, central processing units (CPUs), graphics processing units (GPUs), field programmable gate arrays (FPGAs), digital signal processing units (DSPs), cryptographic processors, microprocessors, microcontrollers, analog-digital converters, application specific integrated circuits (ASICs), and the like. The memory chips may include, for example, a volatile memory device such as a dynamic random-access memory (DRAM) or a static random-access memory (SRAM), or a non-volatile memory device such as a phase-change random-access-memory (PRAM), a magnetoresistive random-access memory (MRAM), a resistive random-access memory (RRAM), or a flash memory.

The encapsulant 130 may be disposed on the rear surface 110BS of the redistribution structure 110 and may encapsulate at least a portion of the semiconductor chip 120. The encapsulant 130 may include, for example, an epoxy molding compound (EMC), but the material of the encapsulant 130 is not particularly limited.

The UBM structure 140 may be electrically connected to the redistribution conductor 112 exposed through the via hole VH. The UBM structure 140 is disposed between the metal bump 150 and the redistribution conductor 112, and may be provided as a plurality of UBM structures 140 in contact with one metal bump 150. In this case, the yield of the SBA process may be improved. For example, the plurality of UBM structures 140 may form a UBM group corresponding to each of the plurality of metal bumps 150, and the UBM group may include a plurality of UBM structures 140 located inside of the metal bump 150 and spaced apart from each other. The plurality of UBM structures 140 may each include a seed layer 141, a UBM via 142, and a UBM pad 143. According to an example embodiment, some of the UBM structures 140 may be connected to each other, and according to an example embodiment the UBM structure 140 and the metal bump 150 may correspond to each other on one-to-one (1:1) basis.

The seed layer 141 extends along the inner surface of the via hole VH and a portion of the front surface 110FS of the redistribution structure 110 (or a portion of the upper surface of the insulating layer 111 based on FIG. 2A), and may be disposed between the insulating layer 111 and the UBM via 142 and the UBM pad 143. An inner surface of the via hole VH may include an inner surface of the insulating layer 111 and a surface of the redistribution conductor 112 exposed through the via hole VH. Accordingly, the seed layer 141 may conformally extend along the inner surface of the insulating layer 111, the exposed surface of the redistribution conductor 112, and at least a portion of the front surface 110FS of the redistribution structure 110. For example, the seed layer 141 may not be disposed between the UBM pad 143 and the UBM via 142, but example embodiments are not limited thereto. The seed layer 141 may be used as a seed layer in a plating process for forming the UBM pad 143 and the UBM via 142, and may be used as a diffusion barrier layer to prevent a metal material constituting the UBM pad 143 and the UBM via 142 from diffusing into the insulating layer 111. For example, the seed layer 141 may include, for example, a first layer including titanium (Ti) or a titanium (Ti) alloy, and a second layer including copper (Cu) or a copper (Cu) alloy. As shown, the end of the seed layer 141 may extend along the front surface 110FS of the redistribution structure 110 to coincide with the end of the UBM pad 143, but example embodiments are not limited thereto.

The UBM via 142 is disposed on the seed layer 141 and may fill the via hole VH of the insulating layer 111. The UBM via 142 may extend from the redistribution conductor 112 to the front surface 110FS of the redistribution structure 110 in the insulating layer 111. The UBM via 142 may include copper (Cu) or a copper (Cu) alloy. In an example embodiment, to form a round surface of the UBM pad 143 and to secure the fillability of the UBM via 142, the plating processes of the UBM pad 143 and the UBM via 142 may be separately performed. For example, the UBM via 142 may be formed by an electroplating process using the seed layer 141, and the UBM pad 143 may be formed by an electroless plating process. This will be described later with reference to FIGS. 3A, 3B, 3C, 3D, 3E, 3F, 3G and 3H. Diameters D1 and D2 of the UBM vias 142 are not particularly limited. For example, the diameters D1 and D2 of the UBM vias 142 may 142 may have various sizes in consideration of a perimeter (e.g., 150R in FIG. 2B) of the metal bump 150 in contact with the UBM pads 143, and the number of the UBM vias 142 disposed within the perimeter. For example, the diameters D1 and D2 of the UBM vias 142 may be about 20 μm or more, for example, in the range of about 20 μm to about 200 μm, about 25 μm to about 100 μm, or about 25 μm to about 50 μm. Also, the plurality of UBM vias 142 may have different diameters D1 and D2. As shown, the UBM vias 142 having a second diameter D2 greater than a first diameter D1 may surround the UBM via 142 having the first diameter D1, but example embodiments are not limited thereto. According to example embodiments, the size and arrangement of the UBM vias 142 may be variously modified.

The UBM pad 143 may include a metal material similar to that of the UBM via 142, for example, copper (Cu) or an alloy of copper (Cu), but may be formed by a plating process separate from a process of the UBM via 142. For example, the UBM pad 143 may be formed by performing an electroless plating process after forming the UBM via 142. Accordingly, the UBM pad 143 is disposed on the front surface 110FS of the redistribution structure 110 to correspond to the UBM via 142, and may have an exposed surface (hereinafter, referred to as 'second surface'). For example, the UBM pad 143 may include a first surface 143S1 extending in a direction parallel to the front surface 110FS and in contact with a portion of the seed layer 141 extending along the UBM via 142 and the front surface 110FS, and a second surface 143S2 convexly protruding from the edge of the first surface 143S1 toward the opposite side of the first surface 143S1 and in contact with the metal bump 150. Because the second surface 143S2 of the UBM pad 143 in contact with the metal bump 150 may have a rounded shape without a bent portion, properties of wetting of the solder ball in the SBA process and the reflow process are improved, and the UBM pad 143 may be prevented from being exposed from the solder ball. Accordingly, the metal bump 150 may cover all of the second surface 143S2 of the UBM pad 143 so that the second surface 143S2 is not exposed, and as a result, damage to the UBM pad 143 may be prevented and the reliability of the semiconductor package 100A can be improved.

For example, the UBM pad 143 may have a central portion (e.g., 143CP in FIG. 2B) overlapping the UBM via 142 along a direction perpendicular to the front surface 110FS, and an edge portion (e.g., 143EP in FIG. 2B) extending from the central portion 143CP in a direction parallel to the front surface 110FS. For example, the edge portion 143EP may not overlap the UBM via 142 along the direction perpendicular to the front surface 110FS. In this case, a thickness 142H of the central portion 143CP may be greater than a thickness of the edge portion 143EP, and a portion of the second surface 143S2 corresponding to the central portion 143CP may be further away from the first surface 143S1 than the rest of the second surface 143S2 corresponding to the edge portion 143EP. The size of the UBM pad 143 is not particularly limited. The UBM pad 143 may have various sizes in consideration of the size of the metal bump 150 and the number of UBM pads 143 disposed in the metal bump 150. For example, an extended length d of the edge portion 143EP may be about 0.5 μm or more, for example, in the range of about 0.5 μm to about 10 μm, about 0.5 μm to about 5 μm, or about 0.5 μm to about 1 μm. If the extended length d of the edge portion 143EP is less than about 0.5 μm, the contact area with the metal bump 150 is not sufficiently secured, and thus, the electrical and physical properties between the UBM pad 143 and the metal bump 150 may be lowered. In addition, a maximum thickness 142H of the central portion 143CP may be about 20 μm or less, for example, in the range of about 0.5 μm to about 20 μm, about 0.5 μm to about 10 μm, or about 1 μm to about 10 μm. As described above, the maximum thickness 142H of the central portion 143CP is not particularly limited, but the UBM pad 143 may have a shape in which the thickness decreases as it moves away from a point having the maximum thickness 142H. Therefore, the metal bump 150 may be formed to cover the entirety of the second surface 143S2 of the UBM pad 143.

For example, the UBM pad 143 may be provided as a plurality of UBM pads 143 overlapping one metal bump 150 along a direction perpendicular to the front surface 110FS. The UBM pads 143 may be disposed in various shapes within a perimeter 150R of the metal bump 150 in contact with the second surface 143S (or the exposed surface) of outermost UBM pads 143. A diameter D3 of the perimeter 150R of the metal bump 150 may be about 150 μm or more, for example, in the range of about 150 μm to about 400 μm, about 200 μm to about 400 μm, or about 250 μm to about 300 μm. Also, as an example, the plurality of UBM pads 143 may be spaced apart from each other, and the metal bump 150 may be in direct contact with the insulating layer 111 exposed between the UBM pads 143. Also, like the UBM vias 142, the arrangement shape of the UBM pads 143 within the perimeter 150R of the metal bump 150 is not limited to the shape illustrated in the drawings.

The metal bump 150 is disposed on the UBM structure 140, and may contact the second surface 143S2 of the UBM pad 143. For example, the metal bump 150 may be disposed on the plurality of UBM pads 143 forming a group, and may contact the second surface 143S2 of each of the plurality of UBM pads 143. The metal bump 150 may include a low melting point metal, for example, tin (Sn) or an alloy (e.g., Sn—Ag—Cu) including tin (Sn). According to related devices, according to a reliability evaluation test such as a highly accelerated stress test (HAST) or the like, the surface of the UBM pad 143 may be exposed from the metal bump 150 and may therefore be vulnerable to corrosion. However, according to an example embodiment, because the metal bump 150 completely covers the exposed surface (e.g., the second surface 143S2) such that the UBM pad 143 is not exposed externally (i.e., outside the metal bump 150), the reliability of the UBM pad 143 may be improved.

FIGS. 3A, 3B, 3C, 3D, 3E, 3F, 3G and 3H are cross-sectional views illustrating a manufacturing process of a semiconductor package according to example embodiments. The cross-sectional views may correspond to the area illustrated in FIG. 2A.

Figure 3A:
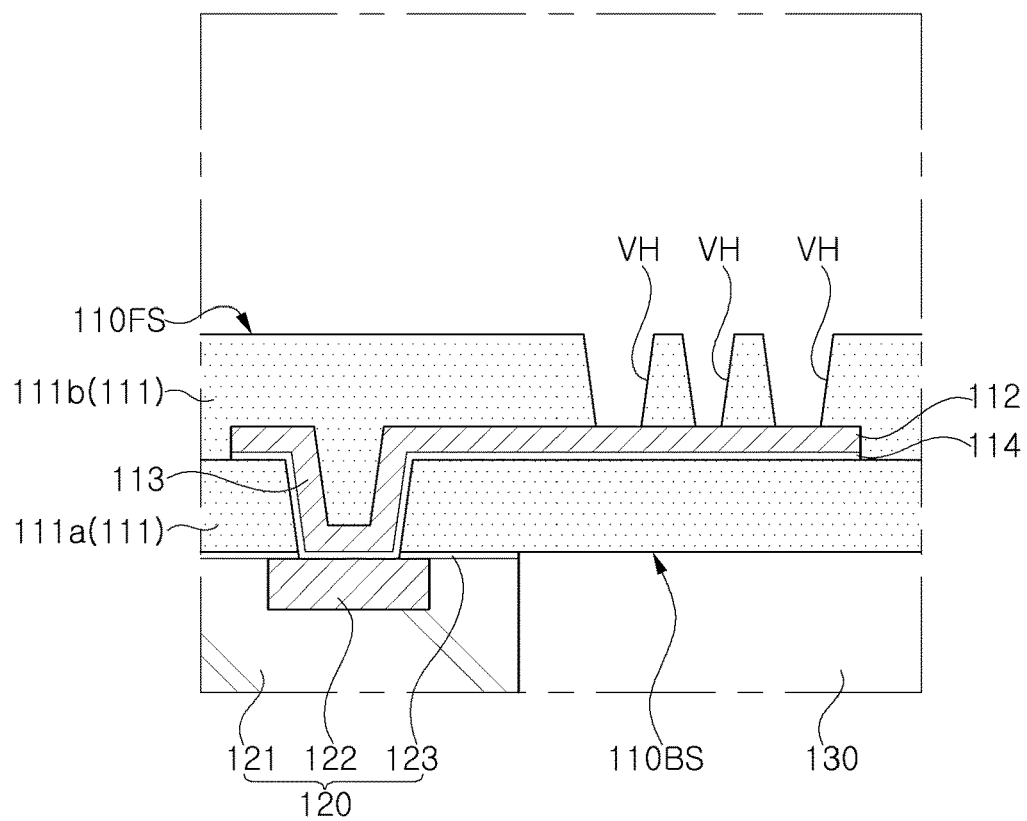
FIGS. 3A, 3B, 3C, 3D, 3E, 3F, 3G and 3H are cross-sectional views illustrating manufacturing processes of the area illustrated in FIG. 2A according to an example embodiment.

Referring to FIG. 3A, a plurality of via holes VH penetrating through the insulating layer 111 to expose a portion of the redistribution conductor 112 may be formed. The insulating layer 111 may be formed on the active surface of the semiconductor chip 120. The side surface and the inactive surface opposite to the active surface of the semiconductor chip 120 are sealed by the encapsulant 130, on a tape carrier, and the insulating layer 111 may be formed on the active surface of the semiconductor chip 120 from which the tape carrier has been removed. In the insulating layer 111, a first insulating layer 111a and a second insulating layer 111b may be sequentially formed. For example, after the first insulating layer 111a is formed, the redistribution conductor 112 including the redistribution seed layer 114 and the via portion 113 may be formed, and the second insulating layer 111b covering the same may be formed. The tape carrier may include an adhesive tape that loses adhesiveness thereof by Ultraviolet (UV) irradiation. The encapsulant 130 may be formed by applying a molding material, such as EMC, and then curing the molding material. The first and second insulating layers 111a and 111b may be formed by, for example, coating and curing PID, and the redistribution seed layer 114 and the redistribution conductor 112 may be formed using a photolithography process, a plating process, an etching process, or the like. The plurality of via holes VH may be formed by a photolithography process including an exposure process, a developing process and the like. The plurality of via holes VH illustrated in the drawings may be understood as formation positions of a UBM structure group connected to one metal bump.

Figure 3B:
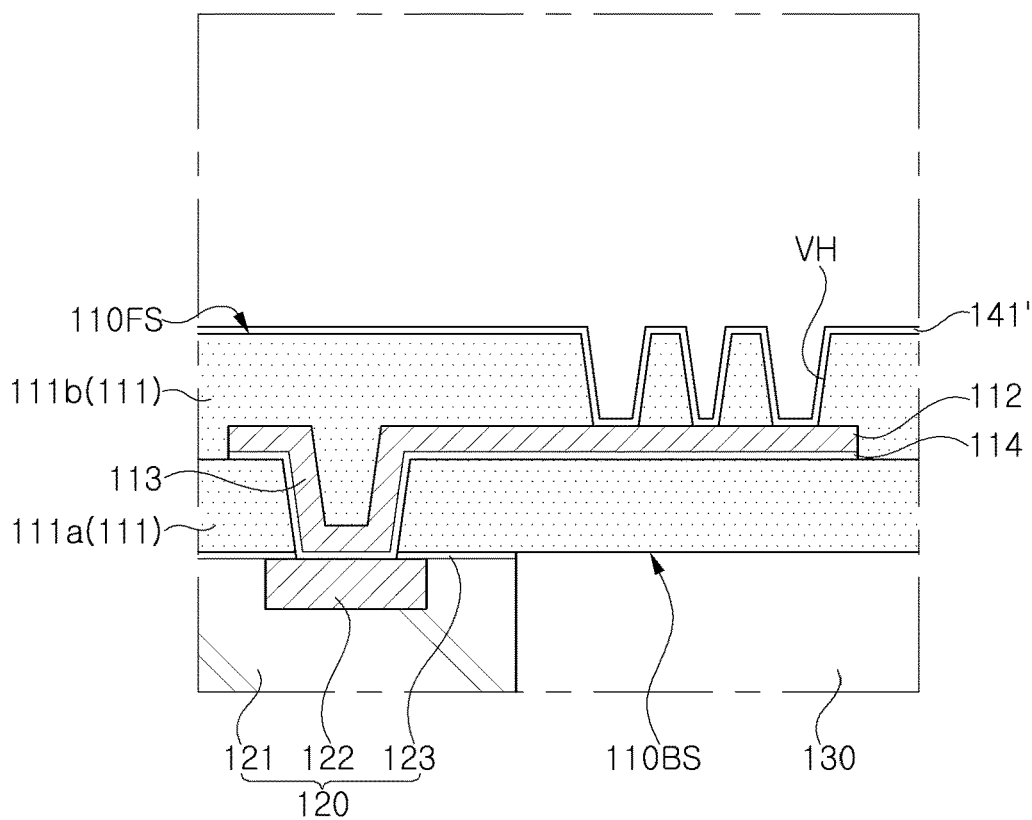

Referring to FIG. 3B, a preliminary seed layer 141' extending along the upper surface of the second insulating layer 111b and inner surfaces of the via holes VH may be formed. The preliminary seed layer 141' may be formed by depositing a metal material, for example, titanium (Ti), copper (Cu), or the like, along the front surface 110FS. The preliminary seed layer 141' may be formed using a process such as electroless plating, chemical vapor deposition (CVD), or physical vapor deposition (PVD). The preliminary seed layer 141' may be formed using, for example, a sputtering process.

Figure 3C:
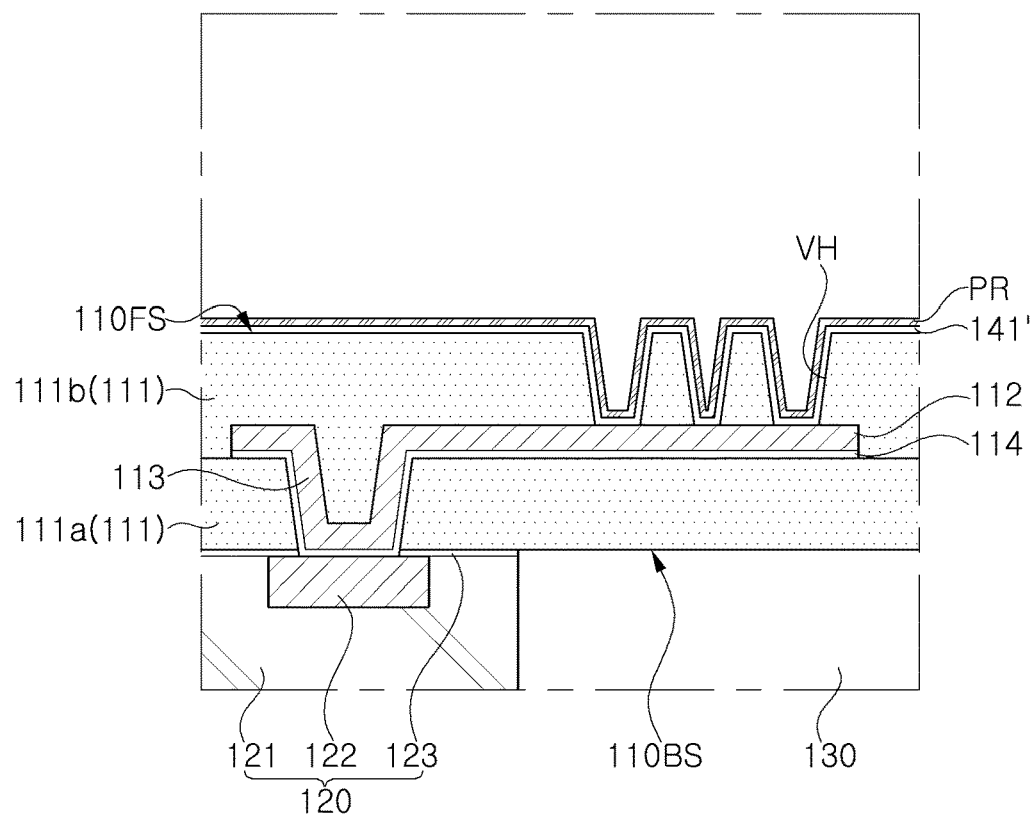

Referring to FIG. 3C, a photoresist layer PR may be formed on the preliminary seed layer 141'. The photoresist layer PR may be formed by coating and curing a photoimageable resin on the preliminary seed layer 141'. The photoresist layer PR may be formed using, for example, a positive-type photoresist.

Figure 3D:
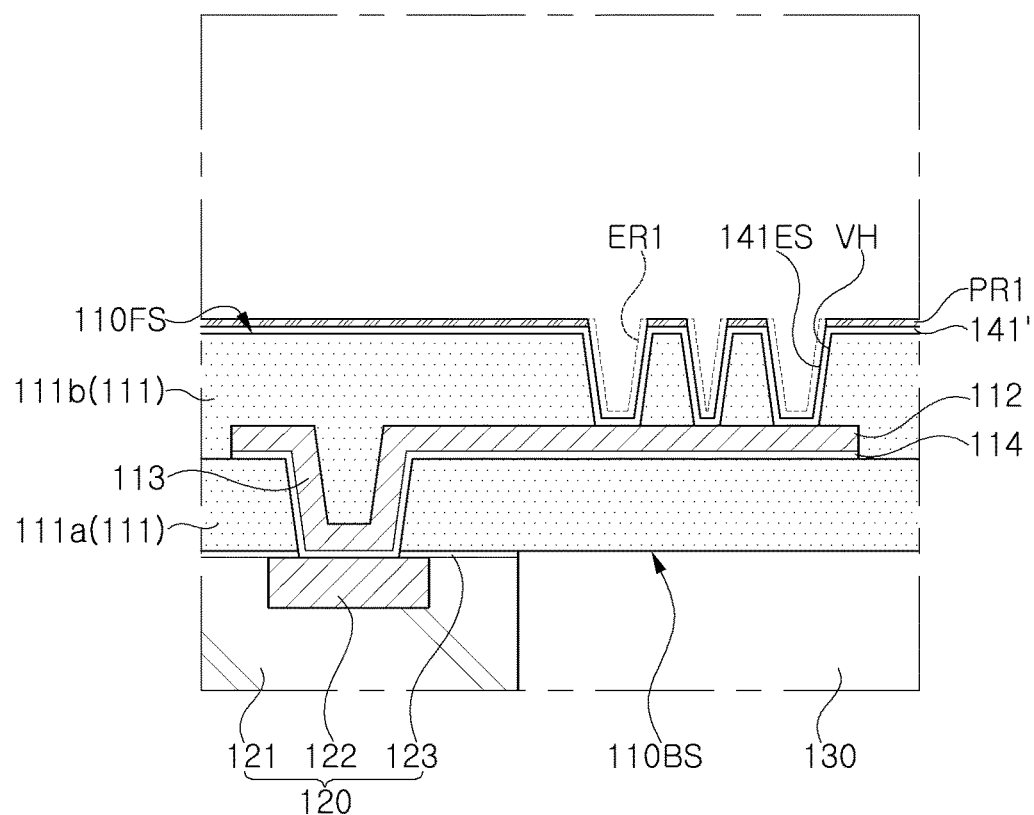

Referring to FIG. 3D, a first photoresist layer PR1 may be formed using a photolithography process. The photolithography process may include an exposure process, a developing process, a cleaning process, and the like. The first photoresist layer PR1 may expose a partial surface 141ES of the preliminary seed layer 141' covering the inner surfaces of the via holes VH. The partial surface 141ES of the preliminary seed layer 141' may be exposed by removing a partial region ER1 of the photoresist layer (e.g., PR in FIG. 3C) by a photolithography process.

Figure 3E:
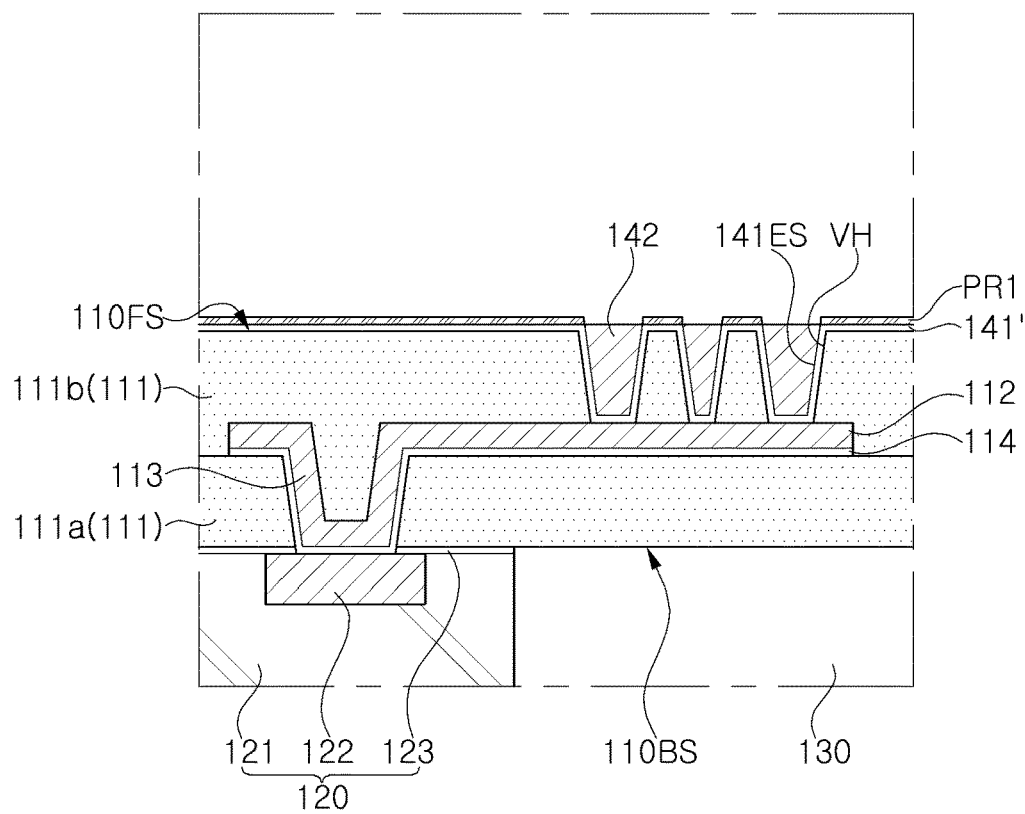

Referring to FIG. 3E, the UBM via 142 may be formed on the partial surface 141ES of the preliminary seed layer 141' exposed by the first photoresist layer PR1. The UBM via 142 may be formed using, for example, an electroplating process such that a metal material is provided in, and for example may fill, the inside of the via holes VH. A formation region of the UBM via 142 may be limited by the first photoresist layer PR1. The UBM via 142 may be formed of, for example, a metal material such as copper (Cu) or an alloy including the same. The upper surface of the UBM via 142 may be formed to be positioned on a level similar to the upper surface of the preliminary seed layer 141'.

Figure 3F:
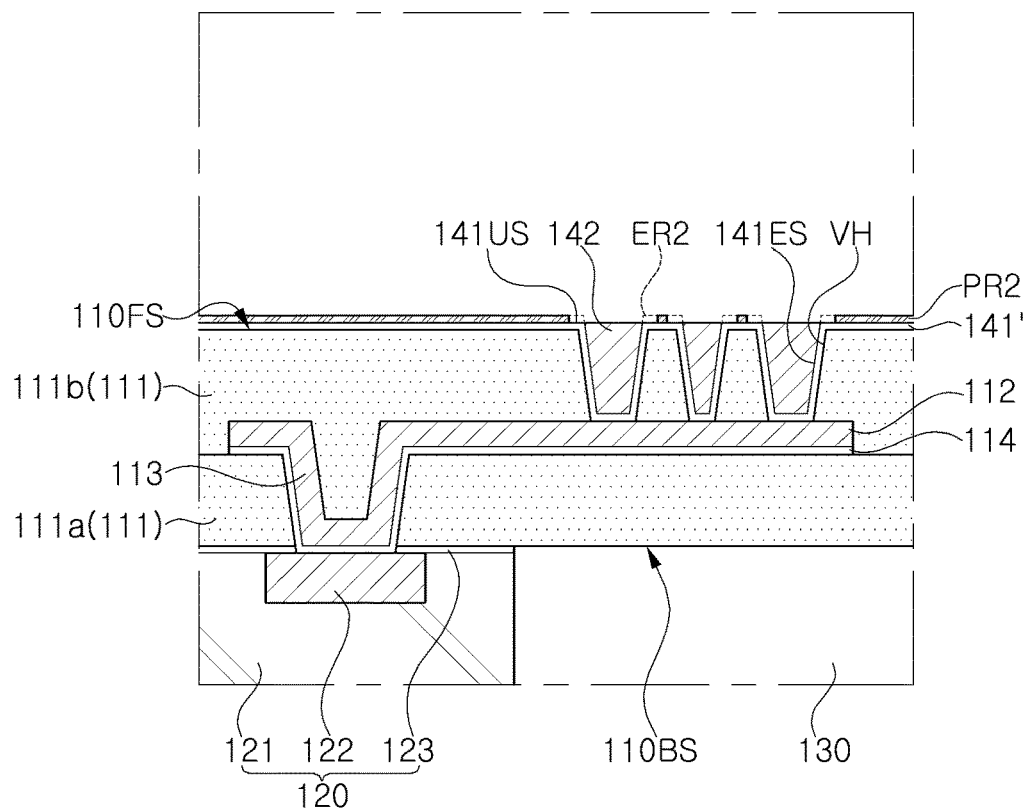

Referring to FIG. 3F, a second photoresist layer PR2 may be formed using a photolithography process. The second photoresist layer PR2 may expose a partial surface 141US of the preliminary seed layer 141' extending along the front surface 110FS of the second insulating layer 111b. The partial surface 141US of the preliminary seed layer 141' may be exposed by removing a partial region ER2 of the first photoresist layer (e.g., PR1 in FIG. 3E) by a photolithography process.

Figure 3G:
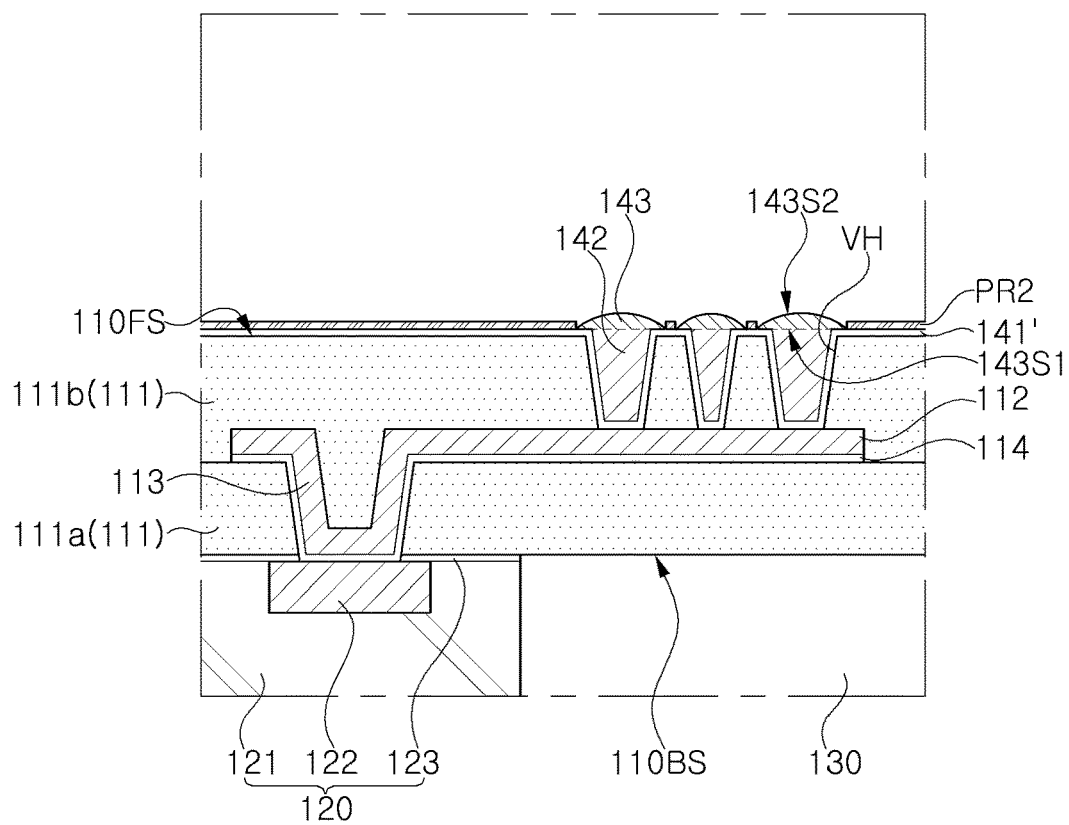

Referring to FIG. 3G, a UBM pad 143 may be formed on the UBM via 142 and the partial surface (e.g., 141US in FIG. 3F) of the preliminary seed layer 141' exposed by the second photoresist layer PR2. The UBM pad 143 may be formed, for example, using an electroless plating process, in such a manner that a metal material protrudes convexly from the UBM via 142 and the partial surface (e.g., 141US in FIG. 3F) of the preliminary seed layer 141'. For example, the UBM pad 143 may be formed to have a first surface 143S1 in contact with the UBM via 142 and the partial surface (e.g., 141US e.g., in FIG. 3F) of the preliminary seed layer 141', and a second surface 143S2 curves away from the first surface 143S1. A formation area of the UBM pad 143 may be limited by the second photoresist layer PR2. The UBM pad 143 may be formed of, for example, a metal material such as copper (Cu) or an alloy containing the same.

Figure 3H:
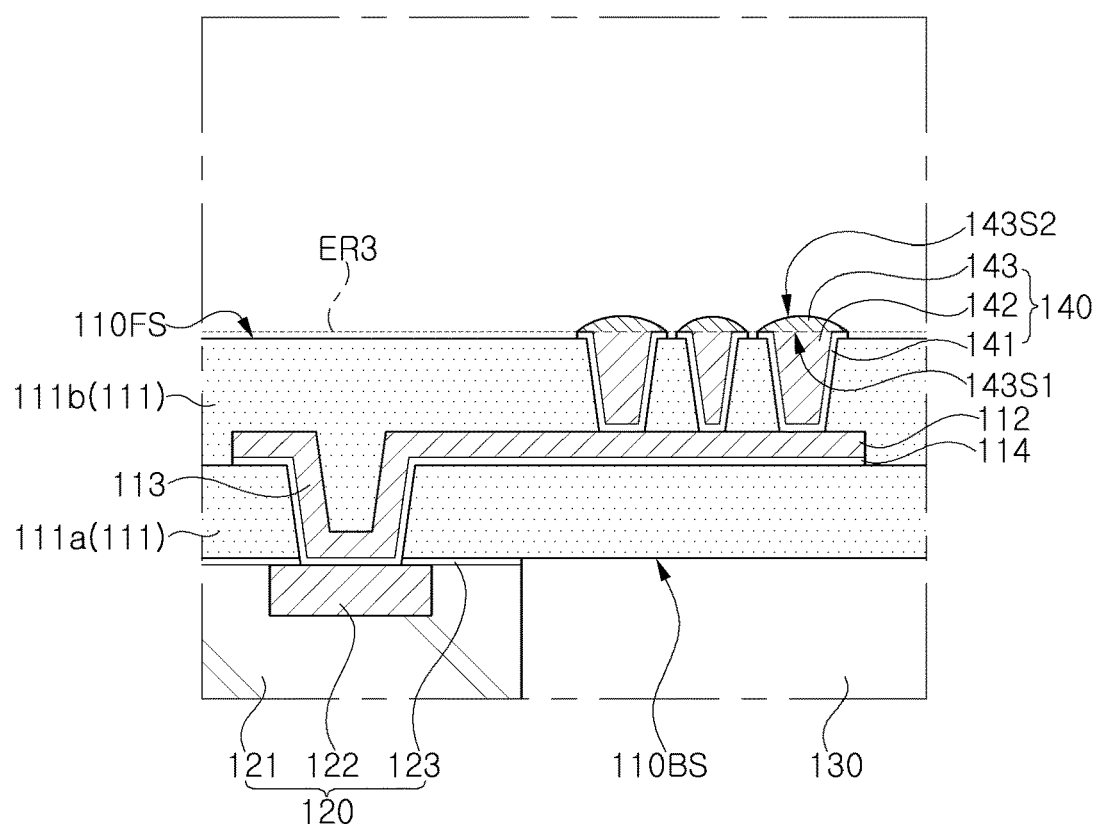

Referring to FIG. 3H, by removing a second photoresist layer (e.g., PR2 in FIG. 3G) and a partial region ER3 of the preliminary seed layer (e.g., 141 in FIG. 3G), UBM structures 140 including a seed layer 141, a UBM via 142, and a UBM pad 143 may be completed. For example, by removing the partial region ER3 of the seed layer (e.g., 141 in FIG. 3G), the UBM structures 140 may be spaced apart from each other. According to an example embodiment, the UBM structures 140 may also be formed to be connected to each other. Thereafter, an SBA process of attaching a solder ball on the UBM structures 140 may be performed, and the solder ball is attached on the UBM structures 140 to form a metal bump (e.g., 150 in FIG. 1) completely covering the second surfaces 143S2 of the UBM pads 143.

Figure 4:
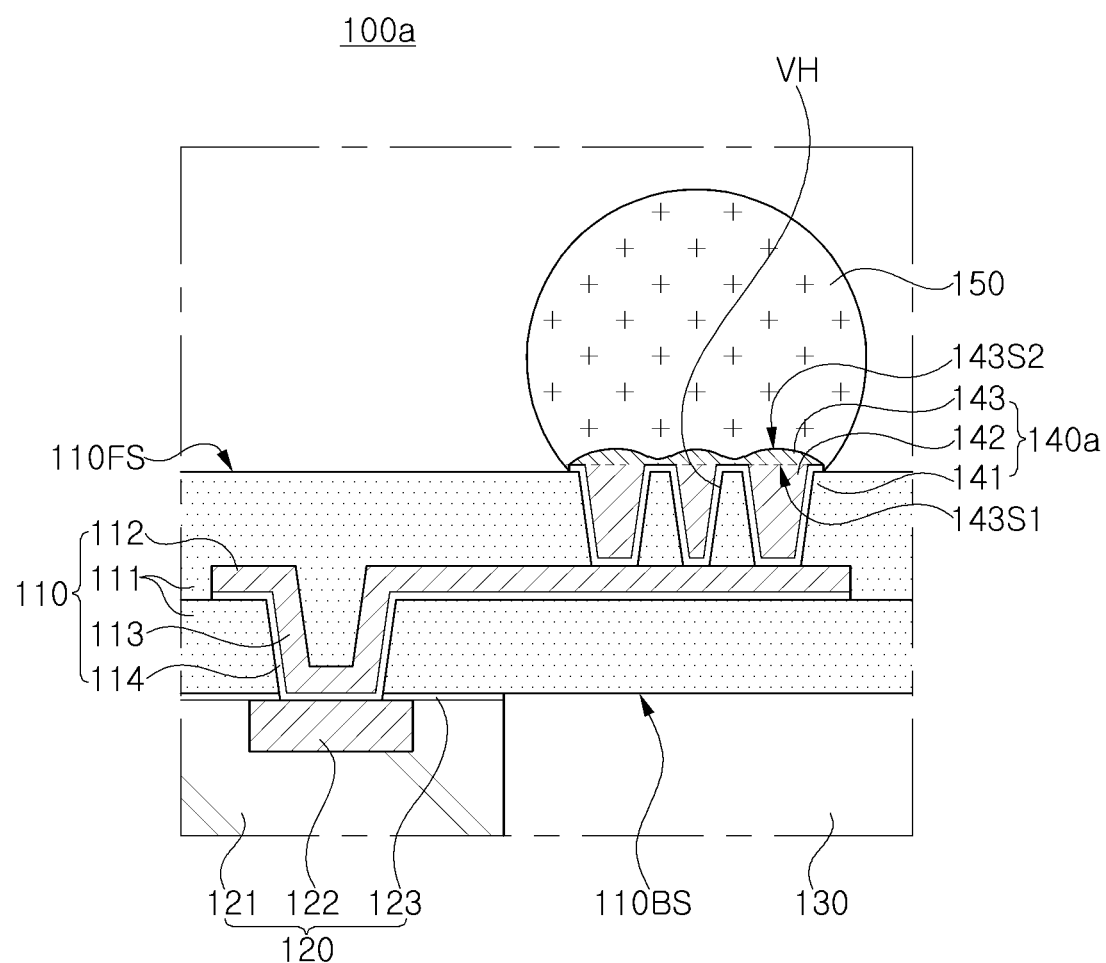
FIG. 4 is a cross-sectional view illustrating a semiconductor package according to an example embodiment.

FIG. 4 is a cross-sectional view illustrating a semiconductor package 100a according to an example embodiment.

Referring to FIG. 4, the semiconductor package 100a according to an example embodiment may have the same or similar characteristics as the semiconductor package 100 of FIGS. 1 to 2B, except that at least some of the UBM structures 140a are connected to each other. For example, the semiconductor package 100a may include a plurality of UBM structures 140a corresponding to one metal bump 150, and a seed layer 141 and a UBM pad 143 of each of the UBM structures 140a may be connected to each other. The UBM pads 143 connected to each other may be integrated along edge portions of each of the UBM pads 143, and may each have a second surface 143S2 having a convex embossing shape toward the metal bump 150. The integrated UBM pads 143 may have a shape having a maximum thickness at central portions overlapping the corresponding UBM vias 142, respectively. Accordingly, the metal bump 150 may be formed to completely cover the second surface 143S2 of the integrated UBM pads 143.

Figure 5A:
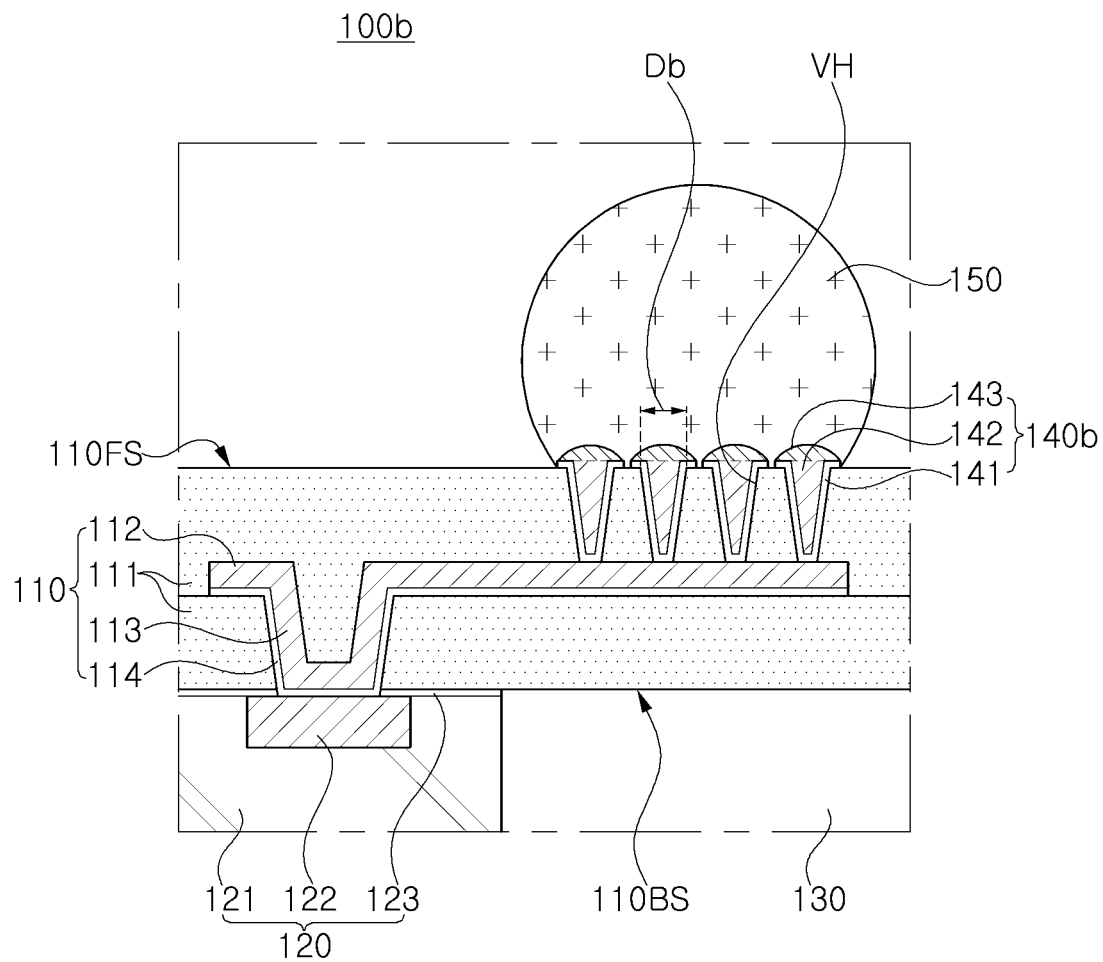
FIGS. 5A and 5B are cross-sectional views illustrating a semiconductor package according to an example embodiment.
Figure 5B:
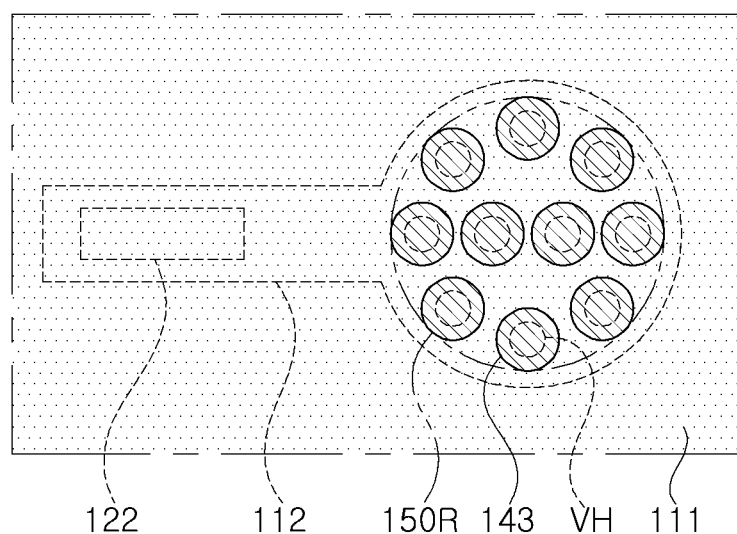

FIGS. 5A and 5B are cross-sectional views illustrating a semiconductor package 100b according to an example embodiment. FIG. 5B is a plan view of the area illustrated in FIG. 5A.

Referring to FIGS. 5A and 5B, the semiconductor package 100b according to an example embodiment may have the same or similar characteristics as those of the semiconductor packages illustrated in FIGS. 1 to 4, except that UBM structures 140b include UBM vias 142 having substantially the same diameter Db. For example, the UBM vias 142 having substantially the same diameter Db may be arranged in various shapes within the perimeter 150R of the metal bump 150 in contact with the UBM pads 143. In this case, the "same diameter Db" indicates that the diameters of the UBM vias 142 are not intentionally formed differently, and may be understood as including a difference due to a process error or the like. As an example, the UBM structures 140b may be arranged, as illustrated in FIG. 5B, in such a manner that some of the UBM pads 143 are disposed in a round shape along the perimeter 150R of the metal bump 150, and the remaining UBM pads 143 are located inside some of the UBM pads 143 disposed in a circle. However, the arrangement of the UBM structures 140b is not limited thereto, and as described with reference to FIG. 2B, the arrangement form of the UBM structures 140b or the UBM pads 143 may be variously modified.

Figure 6:
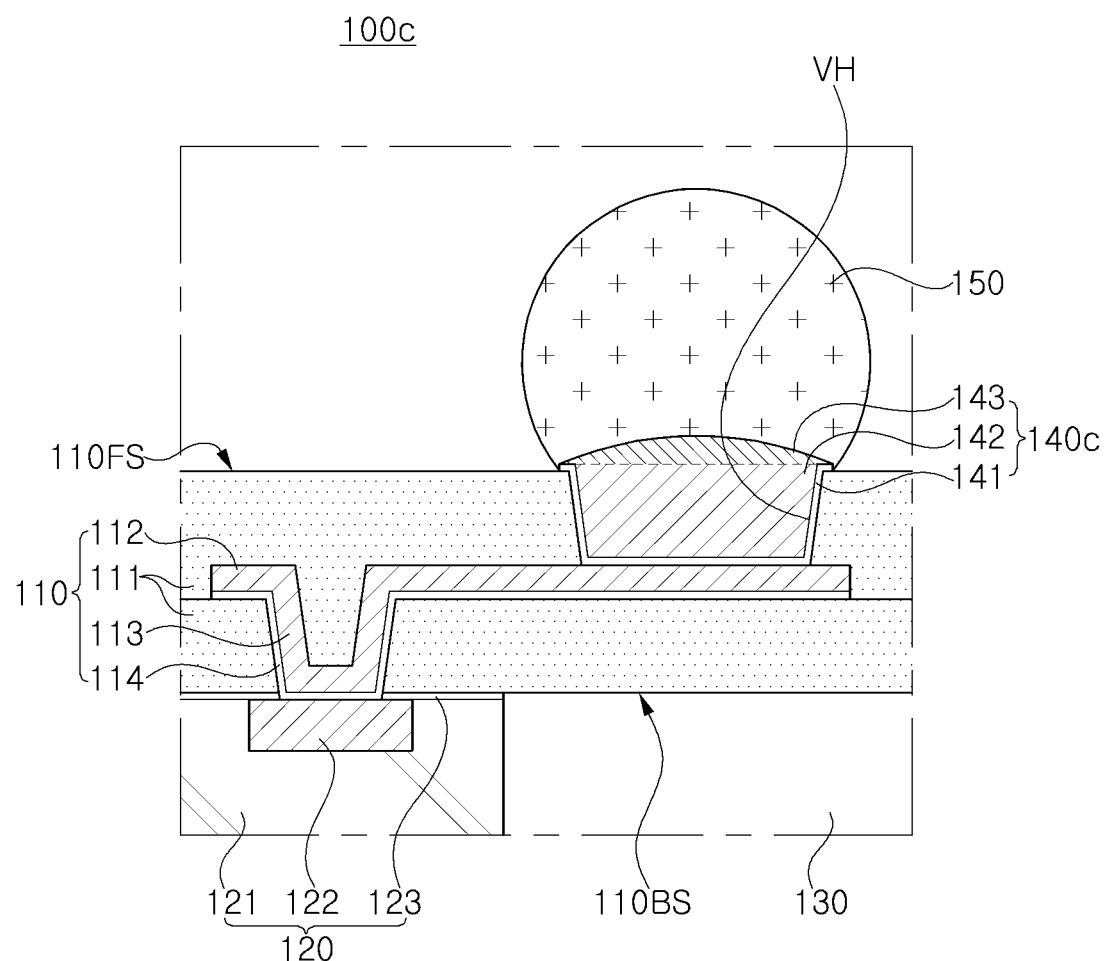
FIG. 6 is a cross-sectional view illustrating a semiconductor package according to an example embodiment.

FIG. 6 is a cross-sectional view illustrating a semiconductor package 100c according to an example embodiment.

Referring to FIG. 6, the semiconductor package 100c of an example embodiment may have the same or similar characteristics as the semiconductor package of FIGS. 1 to 2B, except that a single UBM structure 140c is provided for each metal bump 150. For example, the metal bump 150 may be formed to completely cover the surface of the single UBM pad 143 provided in one UBM structure 140c. For example, when forming the fine-pitch metal bump 150, the metal bump 150 and the UBM structure 140c may be matched one-to-one. In this case, the width of the UBM structure 140c may be secured, and because the metal bump 150 covers the entire upper surface of the UBM pad 143, the reliability of the UBM structure 140c may be improved.

Figure 7:
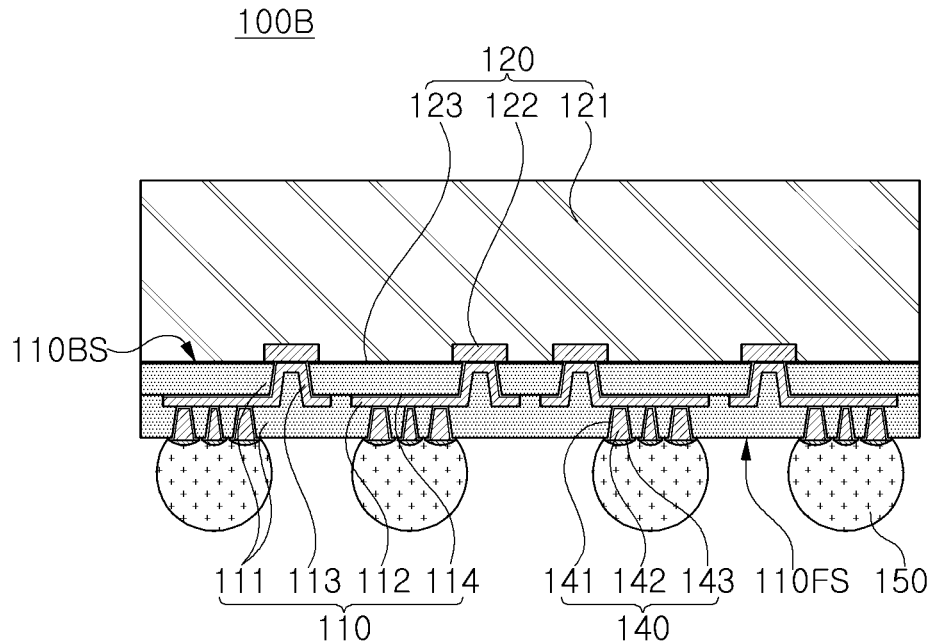
FIG. 7 is a cross-sectional view illustrating a semiconductor package according to an example embodiment.

FIG. 7 is a cross-sectional view illustrating a semiconductor package 100B according to an example embodiment.

Referring to FIG. 7, the semiconductor package 100B according to an example embodiment may have the same or similar characteristics as those of the semiconductor packages of FIGS. 1 to 6, except including a redistribution structure 110 formed in a fan-in region. In this case, the fan-in region refers to a region overlapping the semiconductor chip 120 along a vertical direction. For example, the redistribution structure 110 may be formed only below the active surface of the semiconductor chip 120 on which the connection pad 122 is disposed. Also, the UBM structure 140 or the UBM pad 143 may convexly protrude from the front surface 110FS of the redistribution structure 110, and the metal bump 150 may fully cover the exposed surface of the UBM pad 143.

Figure 8:
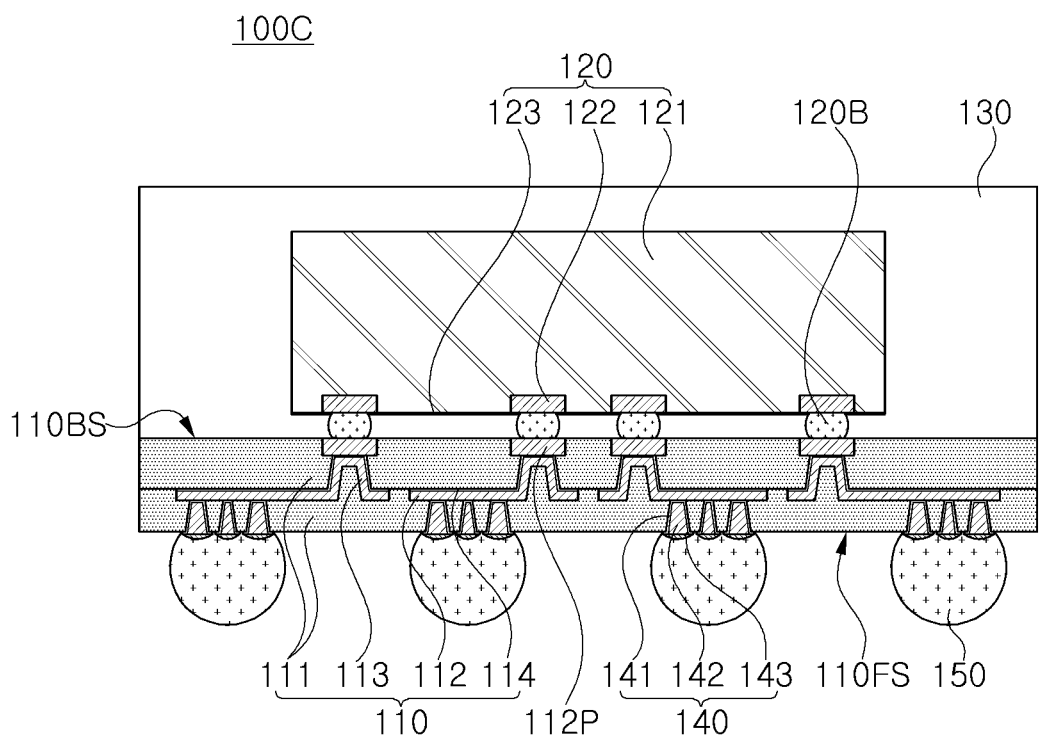
FIG. 8 is a cross-sectional view illustrating a semiconductor package according to an example embodiment.

FIG. 8 is a cross-sectional view illustrating a semiconductor package 100C according to an example embodiment.

Referring to FIG. 8, the semiconductor package 100C according to an example embodiment may have the same or similar characteristics as those of the semiconductor packages of FIGS. 1 to 7, except that the semiconductor chip 120 is electrically connected to the redistribution structure 110 through a connection member 120B. In an example embodiment, the redistribution structure 110 may be a substrate for a semiconductor package, including a printed circuit board (PCB), a ceramic substrate, a glass substrate, a tape wiring board, or the like. The redistribution structure 110 may have a shape different from that illustrated in the drawings depending on the type of the substrate. For example, when the redistribution structure 110 is a printed circuit board, the board may have a form in which a wiring layer is additionally stacked on a copper clad stack plate, or on one side or both surfaces of the copper clad stack plate.

For example, the semiconductor chip 120 may be mounted on the redistribution structure 110 by a flip-chip bonding method. The semiconductor chip 120 is spaced apart from the rear surface 110BS of the redistribution structure 110, and the connection pad 122 of the semiconductor chip 120 may be electrically connected to the redistribution conductor 112 through a connection member 120B such as a solder ball or the like. The redistribution conductor 112 may further include a bump pad 112P exposed on the rear surface 110BS. In some example embodiments, an underfill resin may be formed between the semiconductor chip 120 and the redistribution structure 110. Also, according to an example embodiment, the semiconductor chip 120 may be mounted on the redistribution structure 110 in a wire bonding method. In this case, the semiconductor chip 120 may be attached on the rear surface 110BS of the redistribution structure 110 in a face-up form, and the connection pad 122 of the semiconductor chip 120 may be electrically connected to the redistribution conductor 112 through a bonding wire.

As set forth above, according to example embodiments, a semiconductor package having improved reliability may be provided by introducing a UBM pad having a rounded surface.

While example embodiments have been illustrated and described above, it will be apparent to those skilled in the art that modifications and variations could be made without departing from the scope of the appended claims.

What is claimed is:

1. A semiconductor package comprising:
a redistribution structure having a front surface and a rear surface opposite the front surface, the redistribution structure comprising an insulating layer and a redistribution conductor provided in the insulating layer;
a semiconductor chip provided on the rear surface and comprising a connection pad electrically connected to the redistribution conductor;
an encapsulant provided on at least a portion of the semiconductor chip;
under-bump metal (UBM) vias extending from the redistribution conductor to the front surface of the redistribution structure within the insulating layer;
UBM pads provided on the front surface of the redistribution structure to correspond to the UBM vias, respectively, and each UBM pad of the UBM pads having an exposed surface convexly protruding away from the front surface of the redistribution structure; and
a metal bump provided on the UBM pads and contacting the exposed surface of each UBM pad of the UBM pads,
wherein a boundary surface of the metal bump and each of the UBM pads is defined by the exposed surface of each of the UBM pads, and the metal bump extends between the exposed surface of at least two UBM pads, of the UBM pads, that are provided within a perimeter of the metal bump.

2. The semiconductor package of claim 1, wherein each UBM pad of the UBM pads has a central portion overlapping the UBM vias along a first direction perpendicular to the front surface of the redistribution structure, and an edge portion which does not overlap the UBM vias along the first direction, and
wherein a thickness of the central portion is greater than a thickness of the edge portion.

3. The semiconductor package of claim 2, wherein the edge portion extends, in a second direction parallel to the front surface of the redistribution structure, at least 0.5 µm past the central portion.

4. The semiconductor package of claim 2, wherein a maximum thickness of the central portion along the first direction is about 20 µm or less.

5. The semiconductor package of claim 1, wherein a diameter of a circumference of the metal bump contacting the exposed surface is about 150 µm or more.

6. The semiconductor package of claim 1, wherein each UBM via of the UBM vias has a diameter of about 20 µm or more.

7. The semiconductor package of claim 1, wherein the UBM pads and the UBM vias overlap the metal bump along a first direction perpendicular to the front surface of the redistribution structure.

8. The semiconductor package of claim 1, wherein the UBM pads are spaced apart from each other, and
wherein the metal bump is in direct contact with the insulating layer between the at least two UBM pads that are provided within the perimeter of the metal bump.

9. The semiconductor package of claim 1, wherein the redistribution structure comprises a fan-in region overlapping the semiconductor chip along a first direction perpendicular to the rear surface, and a fan-out region extending from the fan-in region in a second direction parallel to the rear surface.

10. A semiconductor package comprising:
a redistribution structure having a front surface and a rear surface opposite the front surface, the redistribution structure comprising a redistribution conductor and an insulating layer provided on the redistribution conductor, the insulating layer defining a first via hole exposing a first portion of the redistribution conductor and a second via hole exposing a second portion of the redistribution conductor;
a semiconductor chip provided on the rear surface and comprising a connection pad electrically connected to the redistribution conductor;
a first under-bump metal (UBM) structure electrically connected to the redistribution conductor exposed through the first via hole and a second UBM structure electrically connected to the redistribution conductor exposed through the second via hole; and
a metal bump provided on the first UBM structure and the second UBM structure,
wherein the first UBM structure comprises:
a first seed layer extending along an inner surface of the first via hole;
a first UBM via provided on the first seed layer in the first via hole; and
a first UBM pad having a first surface and a second surface, the first surface of
the first UBM structure extending in a direction parallel to the front surface of the redistribution structure and contacting the first UBM via, and the second surface convexly protruding away from the first surface of the first UBM structure and contacting the metal bump,
wherein a second UBM pad of the second UBM structure comprises a first surface and a second surface, the second surface of the second UBM structure convexly protruding away from the first surface of the second UBM structure and contacting the metal bump, and
wherein a boundary surface of the metal bump and the first UBM pad is defined by the second surface of the first UBM pad, a boundary surface of the metal bump and the second UBM pad is defined by the second surface of the second UBM pad, and the metal bump extends between the second surface of the first UBM pad and the second surface of the second UBM pad, within a perimeter of the metal bump.

11. The semiconductor package of claim 10, wherein the inner surface of the first via hole comprises an inner side surface of the insulating layer and a surface of the redistribution conductor exposed through the first via hole, and wherein the first seed layer conformally extends along the inner side surface of the insulating layer, the surface of the redistribution conductor, and a portion of the front surface of the redistribution structure.

12. The semiconductor package of claim 11, wherein the first surface of the first UBM pad contacts the first seed layer along the portion of the front surface of the redistribution structure.

13. The semiconductor package of claim 10, wherein the second surface of the first UBM pad and the second surface of the second UBM pad are completely covered by the metal bump.

14. The semiconductor package of claim 10, wherein the first UBM via and the first UBM pad comprise copper (Cu) or a copper (Cu) alloy, and
wherein the first seed layer comprises titanium (Ti) or a titanium (Ti) alloy.

15. The semiconductor package of claim 10, wherein the metal bump comprises tin (Sn) or a tin (Sn) alloy.

16. A semiconductor package comprising:
a redistribution structure having a front surface and a rear surface opposite the front surface, the redistribution structure comprising a redistribution conductor, and an insulating layer provided on the redistribution conductor, the insulating layer defining a first via hole exposing a first portion of the redistribution conductor and a second via hole exposing a second portion of the redistribution conductor;
a semiconductor chip provided on the rear surface and comprising a connection pad electrically connected to the redistribution conductor;
a first under-bump metal (UBM) structure electrically connected to the redistribution conductor exposed through the first via hole and a second UBM structure electrically connected to the redistribution conductor exposed through the second via hole; and
a metal bump provided on the first UBM structure and the second UBM structure,
wherein the first UBM structure comprises:
a first seed layer extending along an inner surface of the first via hole and a portion of the front surface of the redistribution structure,
a first UBM via provided on the first seed layer in the first via hole, and
a first UBM pad extending in a first direction parallel to the front surface of the redistribution structure, the first UBM pad having a first surface contacting the first UBM via and a portion of the first seed layer, and a second surface convexly protruding away from the first and surface of the first UBM pad,
wherein a second UBM pad of the second UBM structure comprises a first surface and a second surface, the second surface of the second UBM structure convexly protruding away from the first surface of the second UBM structure, and
wherein a boundary surface of the metal bump and the first UBM pad is defined by the second surface of the first UBM pad, a boundary surface of the metal bump and the second UBM pad is defined by the second surface of the second UBM pad, and the metal bump extends between the second surface of the first UBM pad and the second surface of the second UBM pad, within a perimeter of the metal bump.

17. The semiconductor package of claim 16, wherein the first UBM pad has a central portion overlapping the first UBM via along a second direction perpendicular to the front surface of the redistribution structure, and an edge portion provided around a perimeter of the central portion, and
wherein a first portion of the second surface corresponding to the central portion is farther from the first surface than a second portion of the second surface corresponding to the edge portion.

* * * * *